United States Patent [19]

Fleischer et al.

[11] Patent Number: 5,306,348
[45] Date of Patent: Apr. 26, 1994

[54] METAL GROWTH ACCELERATOR SHELL FOR THE CHEMICAL VAPORIZATION DEPOSITION OF DIAMOND

[75] Inventors: James F. Fleischer, Scotia; Thomas R. Anthony, Schenectady, both of N.Y.

[73] Assignee: General Electric Company, Schenectady, N.Y.

[21] Appl. No.: 893,969

[22] Filed: Jun. 3, 1992

Related U.S. Application Data

[63] Continuation of Ser. No. 632,875, Dec. 24, 1990, abandoned.

[51] Int. Cl.$^5$ ............................................. H01L 21/00
[52] U.S. Cl. ..................................... 118/715; 118/724; 118/725; 156/DIG. 68
[58] Field of Search ................... 118/715, 724, 725; 423/446; 156/DIG. 68

[56] References Cited

U.S. PATENT DOCUMENTS

| | | | |
|---|---|---|---|
| 4,347,431 | 8/1982 | Pearce et al. | 118/725 |
| 4,425,315 | 1/1984 | Tsuji et al. | 423/446 |
| 4,707,384 | 11/1987 | Schachner et al. | 427/249 |
| 4,953,499 | 9/1990 | Anthony et al. | 118/724 |
| 4,958,592 | 9/1990 | Anthony et al. | 118/725 |
| 4,982,693 | 1/1991 | Ebato | 118/725 |
| 4,989,543 | 2/1991 | Schmitt | 118/724 |

FOREIGN PATENT DOCUMENTS

| | | |
|---|---|---|
| 297845 | 1/1989 | European Pat. Off. |
| 2128202 | 1/1973 | Fed. Rep. of Germany |
| 62-290869 | 12/1987 | Japan |
| 63-195196 | 8/1988 | Japan |

OTHER PUBLICATIONS

"Handbook of Chemistry and Physics"; 61st ed. CRC Press; ©1981; Weast et al.; pp. E-12 to E-14.
Singh et al., Applied Physics Letters, 52, 451–452 (1988).

*Primary Examiner*—Brian E. Hearn
*Assistant Examiner*—George Goudreau
*Attorney, Agent, or Firm*—William H. Pittman

[57] ABSTRACT

The rate at which diamond is deposited by chemical vapor deposition on a substrate is increased by the presence of an expediting metal such as molybdenum in the surface of a wall exposed to the chemical vapor deposition.

12 Claims, 4 Drawing Sheets

METAL GROWTH ACCELERATOR SHELL FOR THE CHEMICAL VAPORIZATION DEPOSITION OF DIAMOND

This application is a continuation of application Ser. No. 07/632,875, filed Dec. 24, 1990, now abandoned.

This invention relates to diamonds made by the chemical vapor deposition of monolithic diamond onto a substrate, and more particularly to the composition of an inner wall or inner wall surface of the reactor used in the chemical vaporization of diamond.

Various methods are known for the synthetic production of diamond. In particular, the deposition of diamond coatings on substrates to produce cutting and abrasive tools is known.

One class of methods developed in recent years for synthetic diamond deposition consists of the chemical vapor deposition (hereinafter sometimes "CVD") methods. For a general summary of various diamond deposition methods including CVD methods, reference is made to *Chemical & Engineering News*, 67(20), 24–39 (May 15, 1989), incorporated herein by reference In the CVD methods, a mixture of hydrogen and a hydrocarbon gas such as methane is thermally activated and passed into contact with a substrate. The hydrogen gas is converted to atomic hydrogen which reacts with the hydrocarbon to form elemental carbon, which deposits on the substrate in the form of diamond. Many of the CVD diamond coating methods, hereinafter referred to as "filament" methods, employ one or more resistance heating units including heated wires or filaments, typically at temperatures of at least 2000° C., to provide the high activation temperatures at which these conversions take place.

Relatively thick diamond coatings are required in the manufacture of such articles as cutting tools. A long period of time is required to deposit thick diamond coatings as the rate of diamond deposition in a quartz reaction chamber is on the order of 0.65 microns (thickness) per hour.

The present invention is based upon the discovery that the rate that diamond deposits onto a substrate in a reaction chamber can be greatly increased by employing a specific class of metals as a metal shell liner or inner wall in the reaction chamber or by employing a specific class of metals to make a homogeneous outer wall of the reaction chamber. The specific class of metals includes those having a melting point equal to or greater than copper, including copper, nickel, platinum, palladium and molybdenum. The preferred metal is molybdenum. The specific class of metals will be referred to as "expediting metal or metals". By "expediting" is meant that the metal expedites the deposition of diamond on a substrate to a rate of at least 0.8 and preferably to a rate of at least 1.5 microns per hour. The 0.8 and the 1.5 microns per hour refer to the rate of increase of the thickness of diamond deposited By metals is meant not only pure metals but also alloys. For a metal having a melting point near that of copper, the reaction chamber can be cooled, for example by a water jacket. It is preferred that the reaction chamber be made of a metal having a higher melting point than copper and not be cooled by any added cooling means other than convection and conduction caused by the presence of the reaction chamber in the environment. It is also important that the specific class of metals expedite rather than interfere with the deposition of diamond on a substrate. Many forms of steel cause carbonization of the reaction gasses. To avoid this problem, the inner surfaces of a steel reaction vessel can be lined with a metal that expedites the diamond deposition.

In the case of a quartz reaction chamber having a circular cross section, a metal sheet can be bent into the form of a sleeve, placed in the quartz reaction chamber then allowed to spring back against the inner surface of the quartz reaction chamber It is preferred that as much as possible of the entire inner surface be covered with an expediting metal. For example the term "entire inner surface" does not necessarily include areas surrounding the inlet and outlet ports and the areas surrounding electrical conductors which need not be covered with an expediting metal. If partial coverage of the inner surface is employed, it is preferred that a height of the reaction chamber equal to or greater than the height of the substrate be covered with the expediting metal. It is also preferred that the expediting metal extend both above and below the substrate. By covered is meant not only physically covered but also shielded. By shielded is meant that the expediting metal is placed between the substrate, or substrate holding means if no substrate is present, and the outer wall of the reaction chamber The expediting metal can be in the form of a shell liner in contact with the outer wall of the reactor or the expediting metal can be in the form of an inner wall spaced from the outer wall. The spacing is not critical so long as the inner wall is located between the substrates or substrate holding means and the outer wall. It is preferred that the inner wall be spaced from 1 to 25 mm from the outer wall. Again the inner wall can completely enclose the reaction chamber except for limited areas in the vicinity of the gas inlet and exhaust means and the area in the vicinity of the conductor bringing current to the filament(s).

It is also preferred that the expediting metal not be cooled except by normal convection and conduction to the atmosphere and necessary supporting means. In the case of low melting point materials such as copper, it is preferred that such materials be cooled to the degree necessary to prevent physical sagging or melting. Liquid cooling can be employed.

The invention will be described in detail with reference to the drawings, in which:

BRIEF DESCRIPTION OF THE DRAWINGS

Referring now to FIG. 1 of the drawings, there are depicted expediting metal surfaces of a CVD diamond deposition unit according to the present invention. The reaction chamber 1 is airtight and thus capable of being maintained at a reduced pressure. The reaction chamber 1 is fitted with a suitable gas inlet 3 and an exhaust port 5. Wall 7 of reaction chamber 1 is constructed of molybdenum, an expediting metal, which easily withstands filament temperatures on the order of about 2000° C. and substrate temperatures up to about 1000° C.

Figure 1:
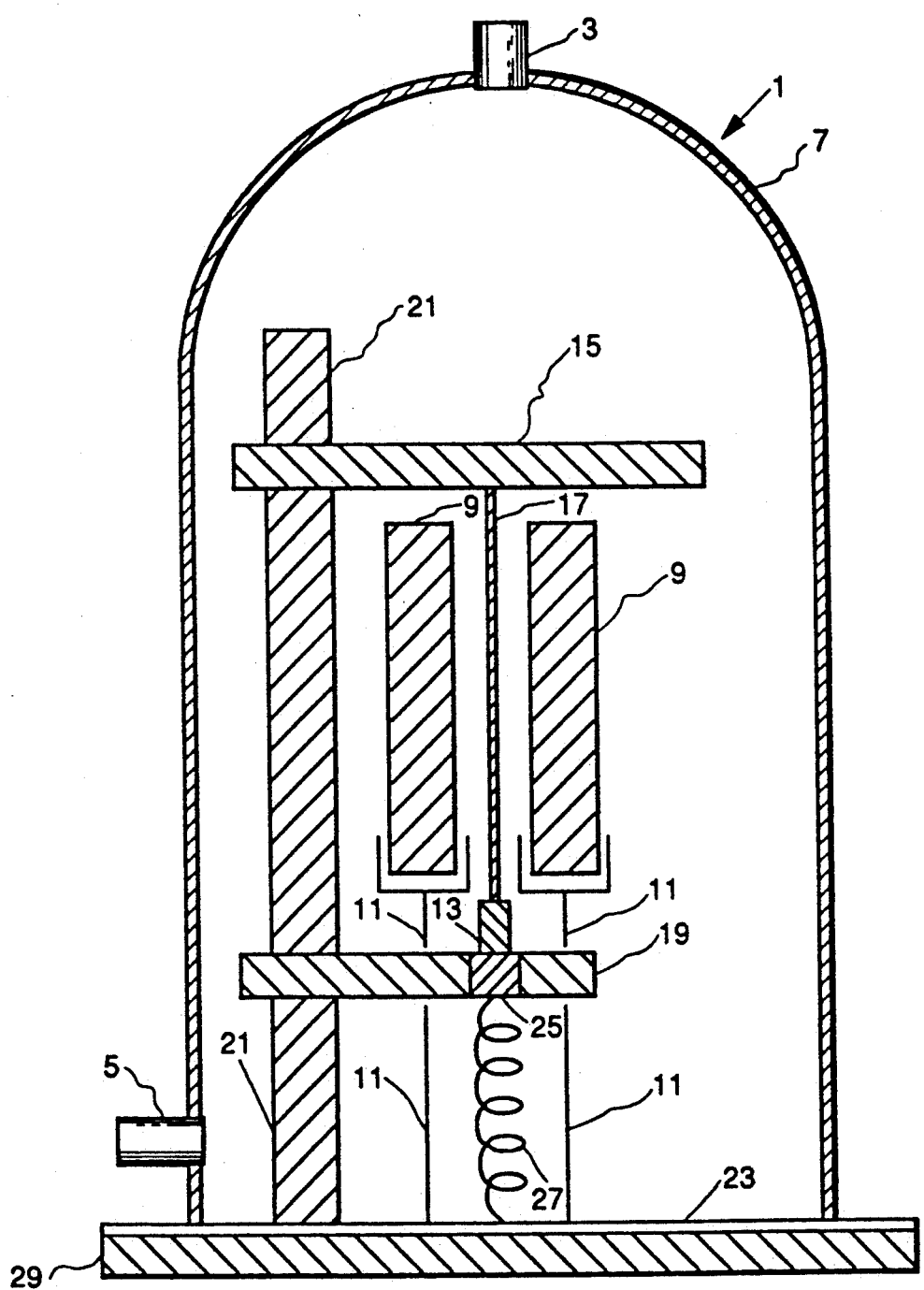
FIG. 1 is a cross sectional view of a CVD diamond deposition unit having an expediting metal outer wall.

The features of the apparatus which are shown in FIG. 1 include a pair of substrates 9 which are normally planar although they may be gently curved. Any substrate material suitable for diamond deposition thereon may be employed; examples of such materials are boron, boron nitride, platinum, graphite, molybdenum, copper, aluminum nitride, silver, iron, nickel, silicon, silicon carbide, silicon nitride, alumina and silica, as well as combinations thereof.

Metallic molybdenum substrates are particularly suitable under many conditions and are often preferred. Supports 11, shown in schematic outline, serve as support means for holding substrates 9 in position parallel to each other and at a suitable spacing for deposition to take place.

The apparatus also contains resistance heating means comprising two electrodes 13 and 15 and a vertically extending electrically conductive filament 17 The material of which said filament 17 is made is not critical, any material known in the art as suitable for this purpose being acceptable. Illustrative materials are metallic tungsten, tantalum, molybdenum and rhenium; because of its relatively low cost and particular suitability, tungsten is often preferred. Filament diameters of about 0.2–1.0 mm. are typical, with about 0.8 mm. frequently being preferred.

The filament 17 is located between said substrates 9, parallel to and substantially equidistant therefrom The distance from the filament to substrates is generally on the order of 5–10 mm.

In the drawings, fixed electrode 15 is grounded through support post 21 to base 23. Base 23 is also made of the expediting metal molybdenum, and base 23 is mounted on aluminum termination ring 29.

Insulator 25, a quartz bearing, electrically insulates electrode 15 and its support 21 from conducting element 27. Conductive element 27 is conductively connected through insulator 25 to a second fixed electrode 13, fixedly attached to the other end of filament 17.

It is preferred to maintain substrates 9 at temperatures in the range of about 700°–1000° C., since within this range maximum diamond growth rate occurs.

In operation the reaction chamber 1 of the apparatus of this invention is maintained at a pressure of up to about 760 torr, typically on the order of 10 torr. A mixture of hydrogen and a hydrocarbon, most often methane and generally present in an amount up to about 2% by volume based on the total gasses, is passed into the chamber 1 and a current is passed through the electrodes 13 and 15 and filament 17 to heat filament 17 to a temperature of at least about 2000° C. With outer wall 7 being constructed entirely of molybdenum excellent growth of diamond particles is expected.

Figure 2:
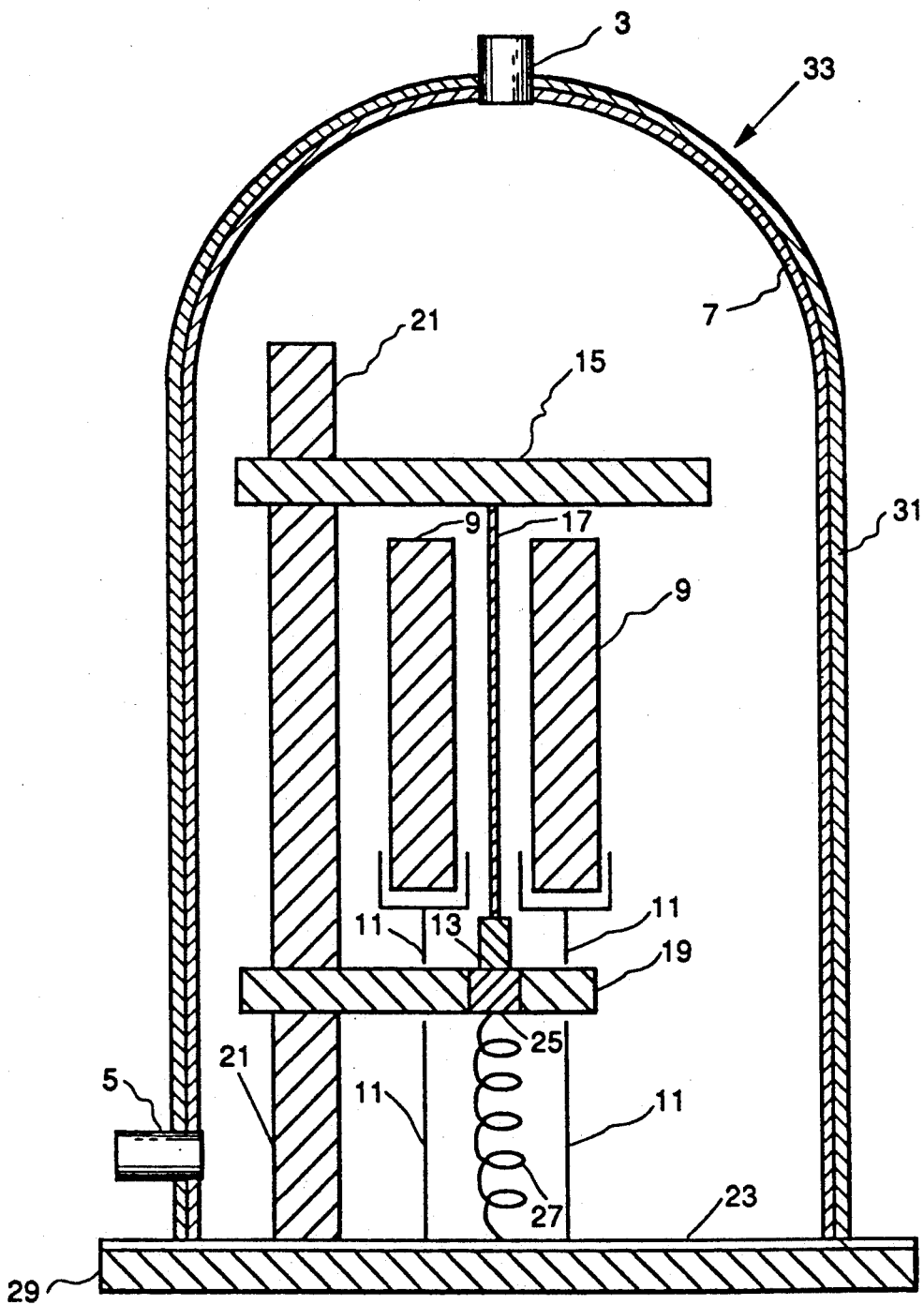
FIG. 2 is a cross sectional view of a CVD diamond deposition unit having an outer wall lined with an expediting metal.

The features of the apparatus which are shown in FIG. 2 include the same features that are shown in FIG. 1 and an additional steel outer wall 31 surrounding molybdenum wall 7 of CVD diamond deposition reactor 33. This arrangement allows a thinner molybdenum wall 7 to be used to expedite the deposition of diamond, while at the same time preventing the presence of steel from interfering with the diamond deposition reaction.

Figure 3:
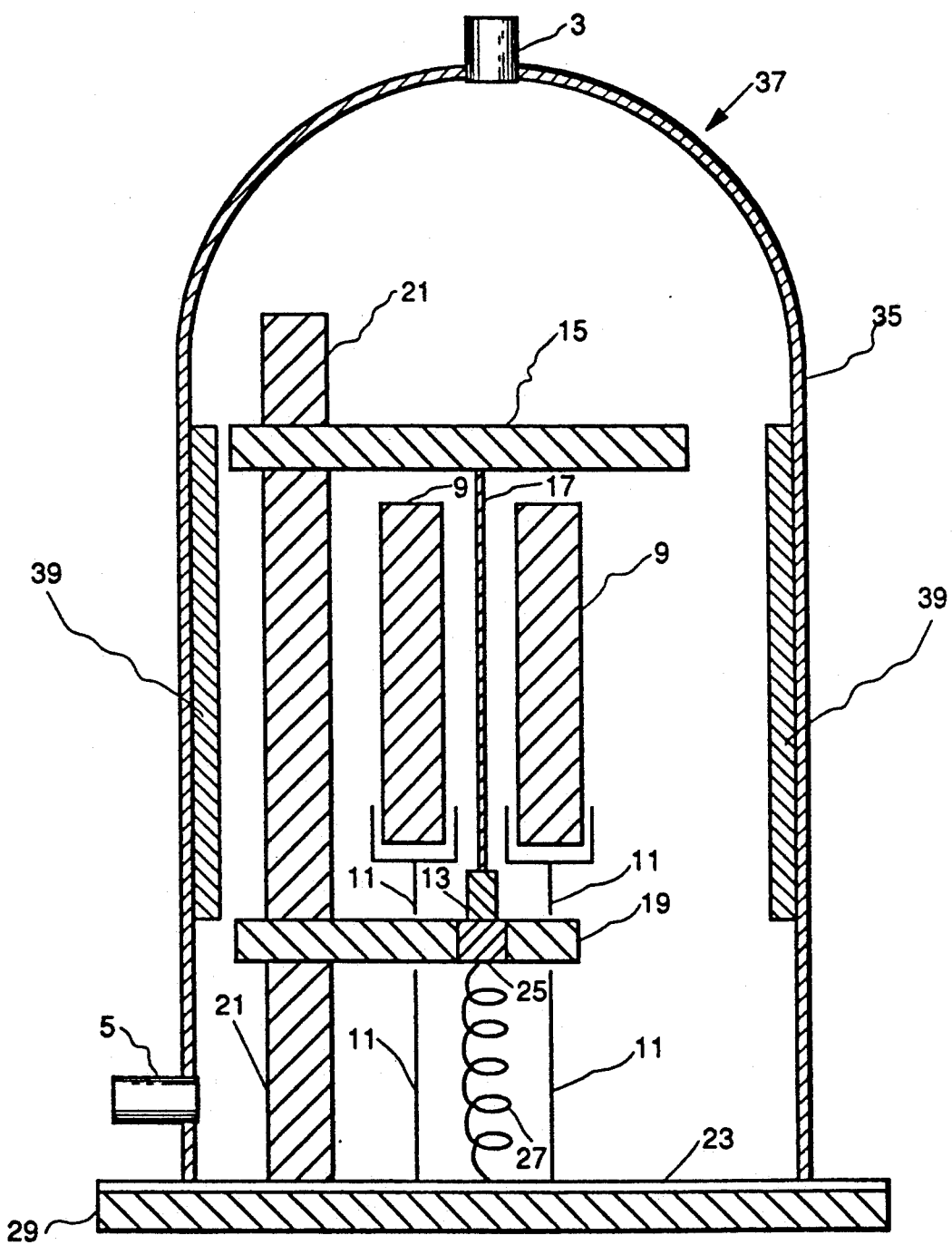
FIG. 3 is a cross sectional view of a CVD diamond deposition unit having a partial inner wall made of expediting metal in contact with the outer wall.

The internal features of the apparatus which are shown in FIG. 3 include the same features that are shown in FIG. 1 with the exception that the wall structure has been changed. The outer wall 35 of the CVD diamond deposition reactor 37 is a quartz outer wall 35 and a partial inner wall 39 is molybdenum. Inner wall 39 was formed by bending a 10 mil (0.25 mm) thick molybdenum sheet into a cylinder having a height of 30.5 cm. (12 inches) and a circular cross section 10 cm. (4 inches) in diameter. The inner wall 39 was inserted into the opening formed by outer wall 7 and allowed to spring into place against the inner surface of outer wall 7. The partial inner wall 39 extended both above and below the substrates 9. The results of using a molybdenum inner wall 39 are set forth below in the Table and compared with a similar CVD of diamond in a reactor without the molybdenum inner wall 39.

| PARAMETER | WITH EXPEDITING METAL INNER WALL | STANDARD |
| --- | --- | --- |
| Growth Rate (Microns/Hr.) | 1.7 | 0.65 |
| Time | 28 Days | 28 Days |
| Gas Flow Rate | 400 cc./min. | 400 cc./min. |
| $CH_4$—$H_2$ | 1.25% $CH_4$ in $H_2$ | 1.25% $CH_4$ in $H_2$ |
| Filament-Substrate Separation | 7 mm. | 6 mm. |
| Filament Dimensions | 0.030 in. (0.076 mm) diameter 9 in. (23 mm) long | 0.030 in. diameter 9 in. long |
| Filament Composition | 218 Tungsten | 218 Tungsten |
| Filament Temperature | 2040° C. | 2040° C. |
| Filament Amps-Volts | 44–37.5 | 44–37.5 |
| Pressure | 10 Torr | 10 Torr |
| Substrates | Three ⅛ × ⅛ × 9 in. (.3 × 1.3 × 22 mm.) | Three ⅛ ×/ /⅛ × 9 in. |
| Substrate Composition | Molybdenum | Molybdenum |

The cause of the large increase in diamond deposition rate is related to the expediting metal nature of the inner wall liner. Previously, when using a copper reactor vessel, an increase of about 80% in diamond deposition rate over that seen in a quartz vessel was observed. The copper vessel was water cooled.

Several guesses that are difficult to prove experimentally can be made as to why the expediting metal wall liner or expediting metal reaction vessel improves the deposition rate.

First, there may be some radical species that slows down diamond deposition. Since the recombination rate on an expediting metal surface is several orders of magnitude higher than on a glass or quartz surface, the expediting metal liner would decrease the concentration of these undesirable species in the reaction chamber.

Second, the metal is a much better reflector of radiation than quartz or glass. The increased radiation reflection with a metal liner whether it was cooled or not may increase the temperature of the gas in the chamber with all of the nominal experimental parameters remaining the same. The increased gas temperature may increase diamond deposition rates.

Third, the gradients of species in the reaction chamber may be more important than their concentrations. The diffusive flux of any species is proportional to their concentration times the gradient of the species. The expediting metal liner by acting as a recombination surface may increase gradients and fluxes of species in the chamber.

Fourth, the quartz or glass may be acting as a mild poisoning agent for CVD deposition. Through chemical reactions and sputtering, silicon, oxygen and various silicon-oxygen compounds may move from the walls of the chamber into the gas phase and slow down critical reactions that determine the deposition rate.

Fifth, the expediting metal liner may act as a chemical getter for some undesirable species. The species may react chemically with the liner, or dissolve in the liner, thereby lowering its concentration in the gas phase.

Prior to the present invention quartz was considered a good material for the construction of a CVD diamond deposition reactor because the recombination rate of atomic hydrogen on a quartz surface is very low. Atomic hydrogen is essential to the diamond deposition reaction. The expediting metals however have a very high recombination coefficient for atomic hydrogen, which would teach one of ordinary skill in the art that atomic hydrogen level in a reactor made of expediting metal would be low and the rate of diamond deposition would also be lowered. Unexpectedly it has been found that the reverse is true.

Figure 4:
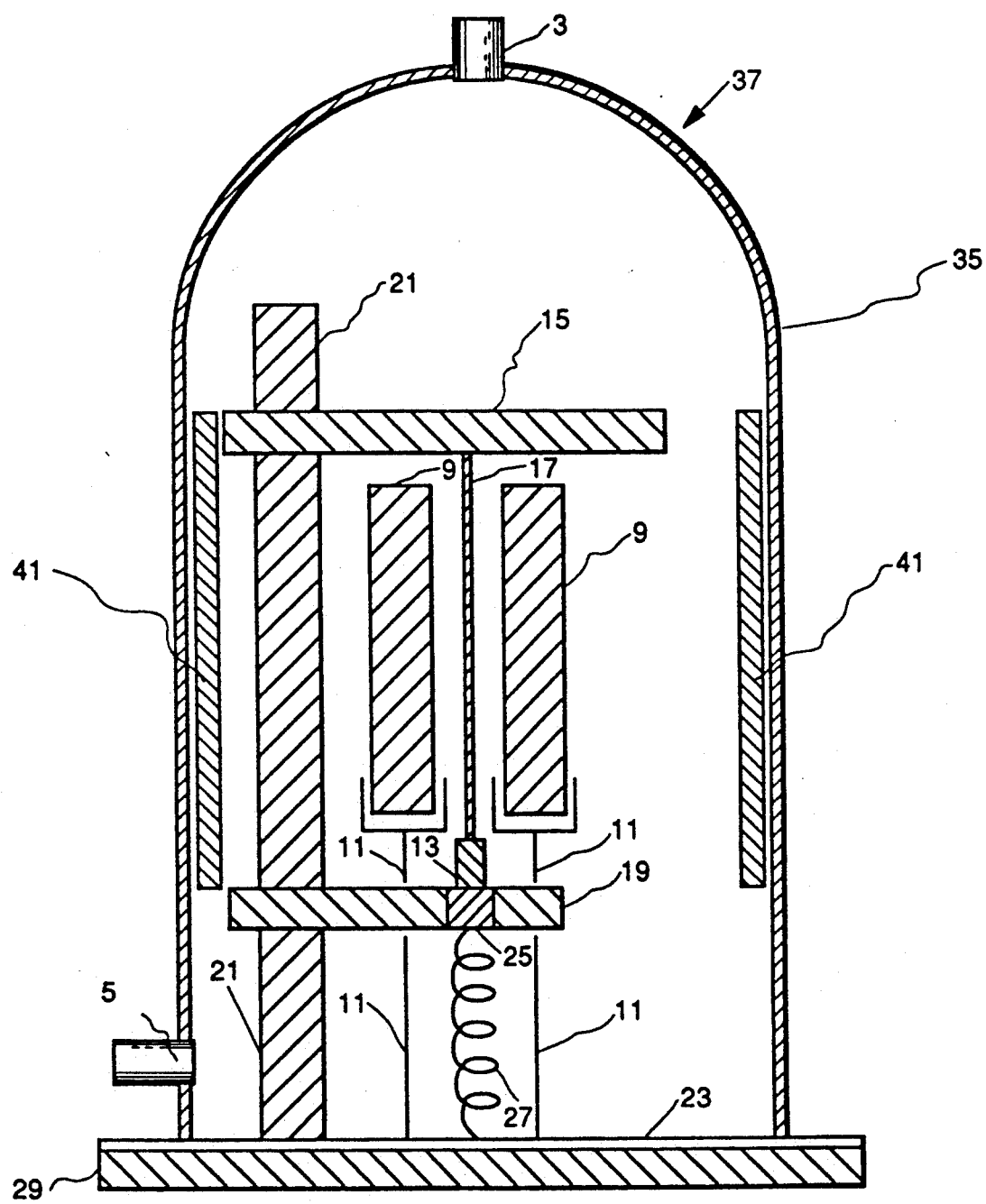
FIG. 4 is a cross sectional view of a CVD diamond deposition unit having a partial inner wall made of expediting metal spaced from the outer wall.

The internal features of the apparatus which are shown in FIG. 4 include the same features that are shown in FIG. 3 with the exception the inner molybdenum wall 41 has been moved in a small distance from outer wall 35 of the CVD diamond deposition reactor. This will allow inner wall 41 to be conductively isolated from outer wall 35 and run at a higher temperature, not being conductively cooled by outer wall 35.

While not all expediting metals and alloys have been identified in the present specification, sufficient guidelines have been provided to one of skill in the art to determine which metals and alloys are expediting. The preferred minimum deposition rate of 1.5 microns per hour, while a significant advance over the prior art, is arbitrary, and with the guidelines provided should be greatly exceeded. The 1 to 25 mm. spacing between the inner and outer walls again is not critical but is suggested to provide thermal isolation of the inner wall from the outer wall.

While emphasis has been on expediting metal in the surface of a wall exposed to the chemical vapor deposition of diamond, the base of the reactor which is exposed to the chemical vapor deposition reaction can also have a minor effect, and preferably contains an expediting metal. Significant improvement in diamond deposition has been obtained with only a portion of the inner wall surface being an expediting metal.

What is claimed is:

1. Apparatus for chemical vapor deposition of diamond, comprising:
   a closed reaction chamber having uncooled, uninsulated walls, at least one gas inlet and at least one exhaust means, said chamber being capable of being maintained at a pressure below atmospheric;
   sources of hydrogen and a hydrocarbon gas for the purpose of feeding said gases to said chamber through said gas inlet;
   at least one continuous uncooled substrate adapted to receive a diamond deposit;
   support means for supporting said substrate in said chamber; and
   at least one heated filament;
   wherein a surface of a wall in the reaction chamber contains an expediting metal having a melting point equal to or higher than copper.

2. The apparatus of claim 1 wherein the metal is selected from the group consisting of copper, nickel, platinum, palladium and molybdenum.

3. The apparatus of claim 2 wherein the metal is molybdenum.

4. The apparatus of claim 3 wherein most of the inner surface of the reaction chamber contains said molybdenum.

5. The apparatus of claim 3 wherein the wall is an inner wall.

6. The apparatus of claim 5 wherein the wall has a height greater than the height of the substrates and extends both above and below the substrates.

7. The apparatus of claim 6 wherein the inner wall is positioned between the substrates and an outer wall.

8. The apparatus of claim 7 wherein the inner wall is spaced a distance of from 1 to 25 mm. from the outer wall.

9. The apparatus of claim 5 wherein the outer wall is quartz.

10. The apparatus of claim 3 wherein the entire inner surface of the reaction chamber wall contains said molybdenum.

11. The apparatus of claim 3 wherein most of the inner surface of the reaction chamber wall contains said molybdenum.

12. The apparatus of claim 3 wherein the entire inner surface of the reaction chamber contains said molybdenum.

* * * * *